US005786249A

United States Patent [19]
Dennison

[11] Patent Number: 5,786,249
[45] Date of Patent: Jul. 28, 1998

[54] METHOD OF FORMING DRAM CIRCUITRY ON A SEMICONDUCTOR SUBSTRATE

[75] Inventor: Charles H. Dennison, Meridian, Id.

[73] Assignee: Micron Technology, Inc., Boise, Id.

[21] Appl. No.: 612,164

[22] Filed: Mar. 7, 1996

[51] Int. Cl.$^6$ .................. H01L 21/8242; H01L 21/20
[52] U.S. Cl. ..................... 438/241; 438/253; 438/396
[58] Field of Search ........................ 438/241, 253, 438/396

[56] References Cited

U.S. PATENT DOCUMENTS

| | | | |
|---|---|---|---|
| 5,026,657 | 6/1991 | Lee et al. | 437/47 |
| 5,134,085 | 7/1992 | Gilgen et al. | 437/47 |
| 5,283,204 | 2/1994 | Rhodes et al. | 438/396 |
| 5,332,687 | 7/1994 | Kuroda | 438/241 |
| 5,362,666 | 11/1994 | Dennison | 438/396 |
| 5,439,835 | 8/1995 | Gonzalez | 438/241 |
| 5,504,029 | 4/1996 | Murata et al. | 438/241 |
| 5,605,857 | 2/1997 | Jost et al. | 438/396 |
| 5,716,862 | 2/1998 | Ahmad et al. | 438/241 |

Primary Examiner—Charles L. Bowers, Jr.
Assistant Examiner—Toniae M. Thomas
Attorney, Agent, or Firm—Wells, St. John, Roberts, Gregory & Matkin, P.S.

[57] ABSTRACT

A method of forming DRAM circuitry includes, a) defining a memory array area on a substrate for formation of first conductivity type DRAM field effect transistors and defining an area peripheral to the array on the substrate for formation of second conductivity type transistors; b) providing a plurality of patterned gate lines within the array area and the peripheral area, the gate lines defining respective source areas and drain areas adjacent thereto; c) providing capacitor storage nodes over selected array source areas; d) providing a capacitor dielectric layer and an electrically conductive capacitor cell plate layer over the storage nodes and the peripheral area; and e) in two separate photomasking and two separate etching steps, etching the cell plate layer to substantially remove cell plate material from the peripheral area and provide bit line contact openings through the cell plate layer to selected drains in the array area. The method further includes, in two separate photomasking and two separate etching steps, collectively a) etching the capacitor cell plate layer to substantially remove cell plate material from the NMOS peripheral area and thereafter doping the NMOS peripheral area with n-type material, and b) etching the capacitor cell plate layer to substantially remove cell plate material from the PMOS peripheral area and thereafter doping the PMOS peripheral area with p-type material.

55 Claims, 14 Drawing Sheets

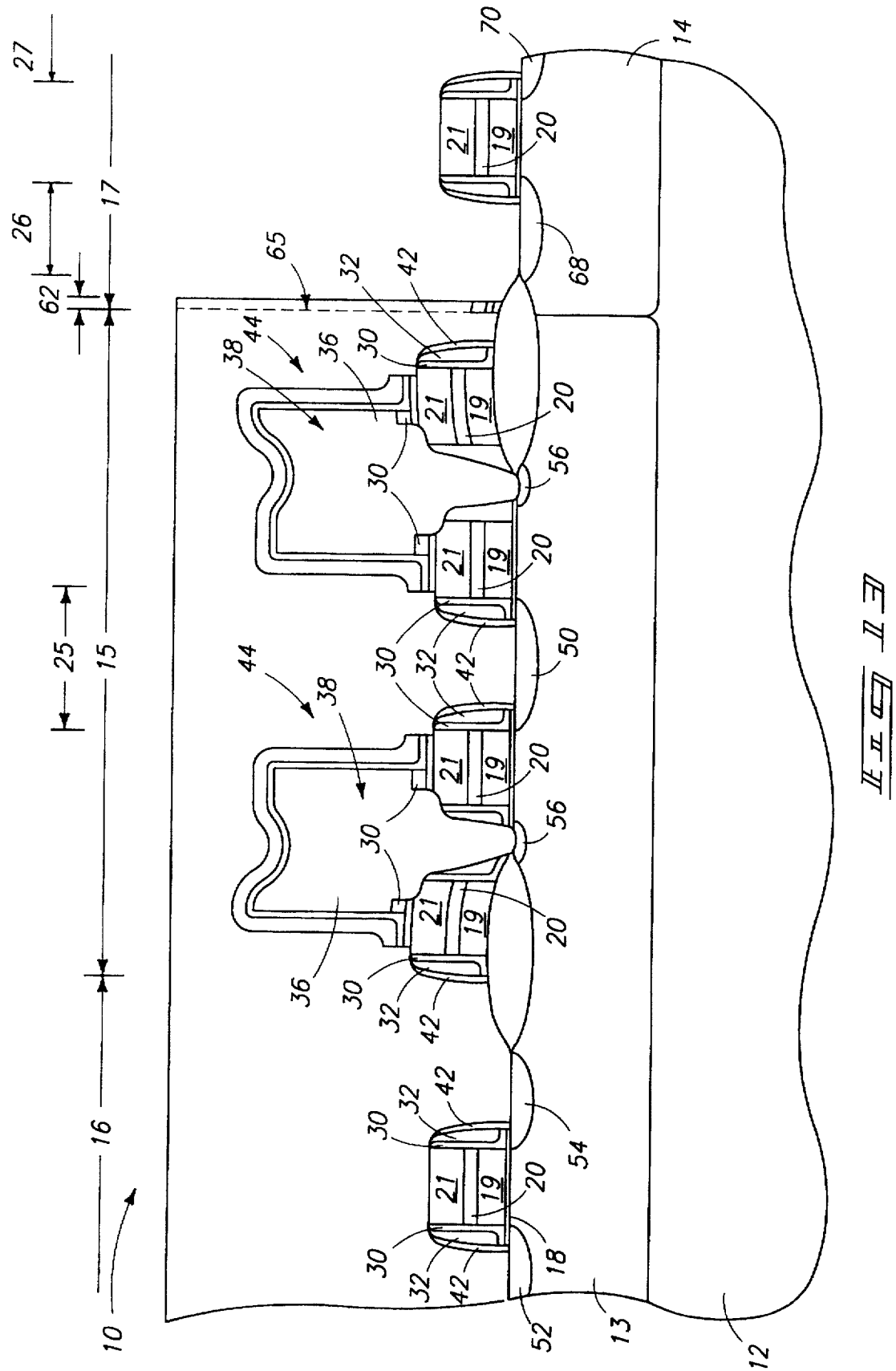

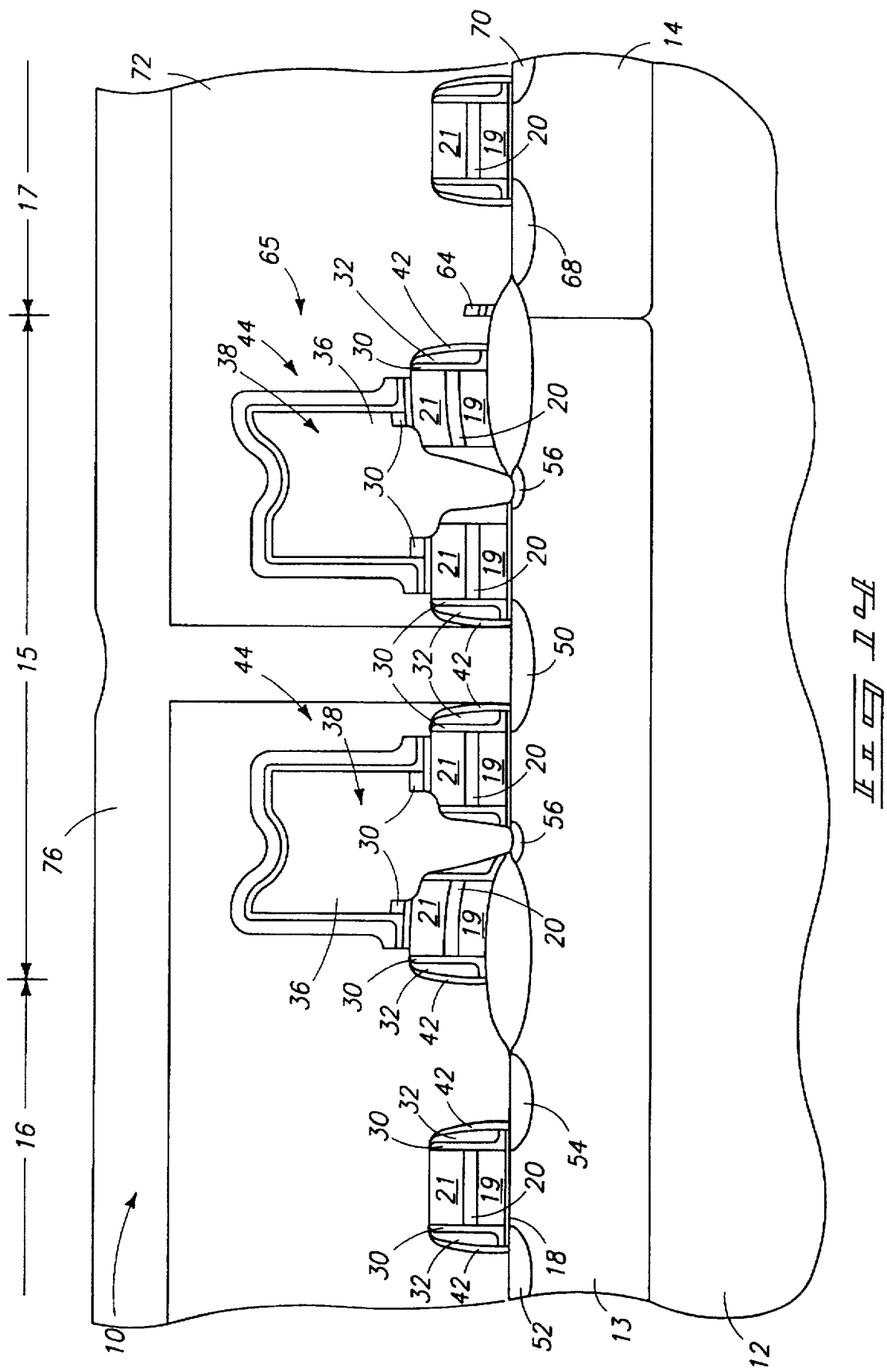

5,786,249

METHOD OF FORMING DRAM CIRCUITRY ON A SEMICONDUCTOR SUBSTRATE

TECHNICAL FIELD

This invention relates to methods of forming DRAM circuitry.

BACKGROUND OF THE INVENTION

High density integrated circuitry is principally fabricated from semiconductor wafers. An MOS (metal-oxide-semiconductor) structure in semiconductor processing is created by superimposing several layers of conducting, insulating and transistor forming materials. After a series of processing steps, a typical structure might comprise levels of diffusion, polysilicon and metal that are separated by insulating layers Upon fabrication completion, a wafer contains a plurality of identical discrete die areas which are ultimately cut from the wafer to form individual chips. Die areas or cut dies are tested for operability, with good dies being assembled into separate encapsulating packages which are used in end-products or systems.

CMOS is so-named because it uses two types of transistors, namely an n-type transistor (NMOS) and a p-type transistor (PMOS). These are fabricated in a semiconductor substrate, typically silicon, by using either negatively doped silicon that is rich in electrons or positively doped silicon that is rich in holes. Different dopant ions are utilized for doping the desired substrate regions with the desired concentration of produced holes or electrons.

NMOS remained the dominant MOS technology as long as the integration level devices on a chip was sufficiently low. It is comparatively inexpensive to fabricate, very functionally dense, and faster than PMOS. With the dawning of large scale integration, however, power consumption in NMOS circuits began to exceed tolerable limits. CMOS represented a lower-power technology capable of exploiting large scale integration fabrication techniques.

One type of integrated circuitry comprises memory. The basic unit of semiconductor memory is the memory cell. Capable of storing a single bit of information, the memory cell has steadily shrunk in size to enable more and more cells per area of a semiconductor substrate or wafer. Such enables integrated memory circuitry to be more compact, as well as faster in operation.

Example semiconductor memories include ROMs, RAMs, PROMs, EPROMs and EEPROMs. Some emphasize compactness and economy over speed. Others focus on lightening-fast operation. Some store data indefinitely, while others are so temporary they must be refreshed hundreds of times every second. One of the smallest memory cell comprises the single transistor and single capacitor of a dynamic random access memory (DRAM).

BRIEF DESCRIPTION OF THE DRAWINGS

Preferred embodiments of the invention are described below with reference to the following accompanying drawings.

FIG. 13 is a view of the FIG. 1 wafer fragment at a processing step subsequent to that shown by FIG. 12.

FIG. 14 is a view of the FIG. 1 wafer fragment at a processing step subsequent to that shown by FIG. 13

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming DRAM circuitry on a semiconductor substrate having complementary metal oxide semiconductor field effect transistors and associated capacitors comprising the following steps:

defining a memory array area on a substrate for formation of first conductivity type DRAM field effect transistors and defining an area peripheral to the array on the substrate for formation of second conductivity type field effect transistors;

providing a plurality of patterned gate lines within the memory array area and the peripheral area, the gate lines defining respective source areas and drain areas adjacent thereto;

providing capacitor storage nodes over selected array source areas;

providing a capacitor dielectric layer and an electrically conductive capacitor cell plate layer over the capacitor storage nodes and the peripheral area; and in two separate photomasking and two separate etching steps, collectively etching the capacitor cell plate layer to substantially remove cell plate material from the peripheral area and provide bit line contact openings through the capacitor cell plate layer to selected drains in the array area.

In another aspect of the invention, a method of forming DRAM circuitry on a semiconductor substrate having complementary metal oxide semiconductor field effect transistors and associated capacitors comprising the following steps:

defining a memory array area on a substrate for formation of first conductivity type DRAM field effect transistors and defining an NMOS peripheral area and a PMOS peripheral area;

providing a plurality of patterned gate lines within the memory array area and the peripheral areas, the gate lines defining respective source areas and drain areas adjacent thereto;

providing capacitor storage nodes over selected array source areas;

providing a capacitor dielectric layer and an electrically conductive capacitor cell plate layer over the capacitor storage nodes and the peripheral areas; and in two separate photomasking and two separate etching steps, collectively, a) etching the capacitor cell plate layer to substantially remove cell plate material from the NMOS peripheral area and thereafter doping the NMOS peripheral area with n-type material, and b) etching the capacitor cell plate layer to substantially remove cell plate material from the PMOS peripheral area and thereafter doping the PMOS peripheral area with p-type material.

Figure 1:
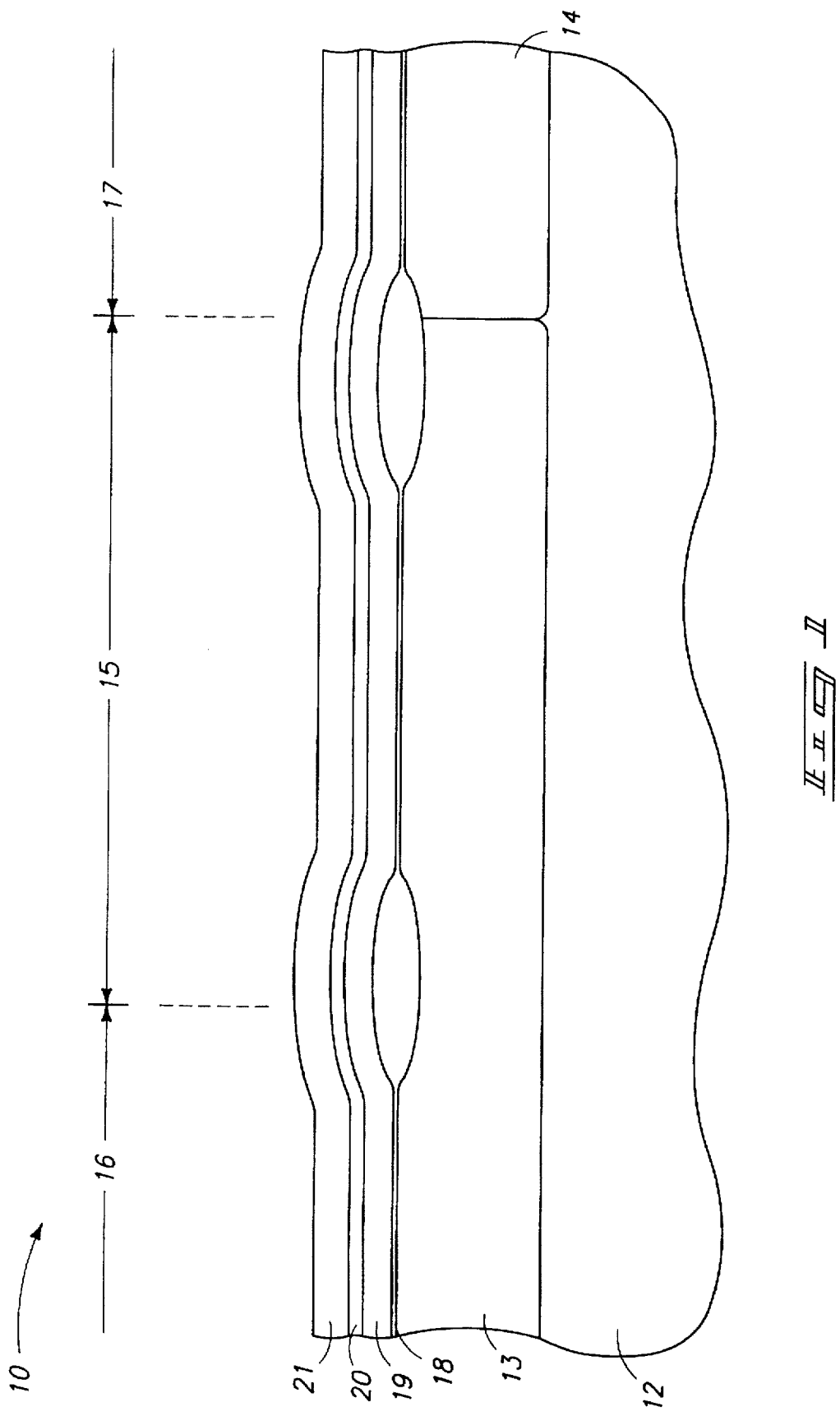
FIG. 1 is a diagrammatic sectional view of a semiconductor wafer fragment at one processing step in accordance with the invention

Referring first to FIG. 1, a wafer fragment in process is indicated generally with reference numeral 10. Such comprises a bulk monocrystalline silicon substrate 12 having a p-well 13 for provision of NMOS circuitry and an n-well 14 for provision of PMOS circuitry. For purposes of the continuing discussion, wafer fragment 10 comprises a memory array area 15 for formation of first conductivity type DRAM field effect transistors and first peripheral area 16 and second peripheral area 17 outside of or peripheral to array area 15 for formation of first and second conductivity type transistors, respectively. In the preferred embodiment, the array transistors will comprise NMOS transistors, with the first conductivity type thus being n and the second conductivity type being p.

A gate oxide layer 18, conductively doped polysilicon layer 19, silicide formed layer 20, and insulating oxide layer 21 are provided.

Example respective thicknesses include 130 Angstroms, 1250 Angstroms, 1200 Angstroms, and 2750 Angstroms.

Figure 2:
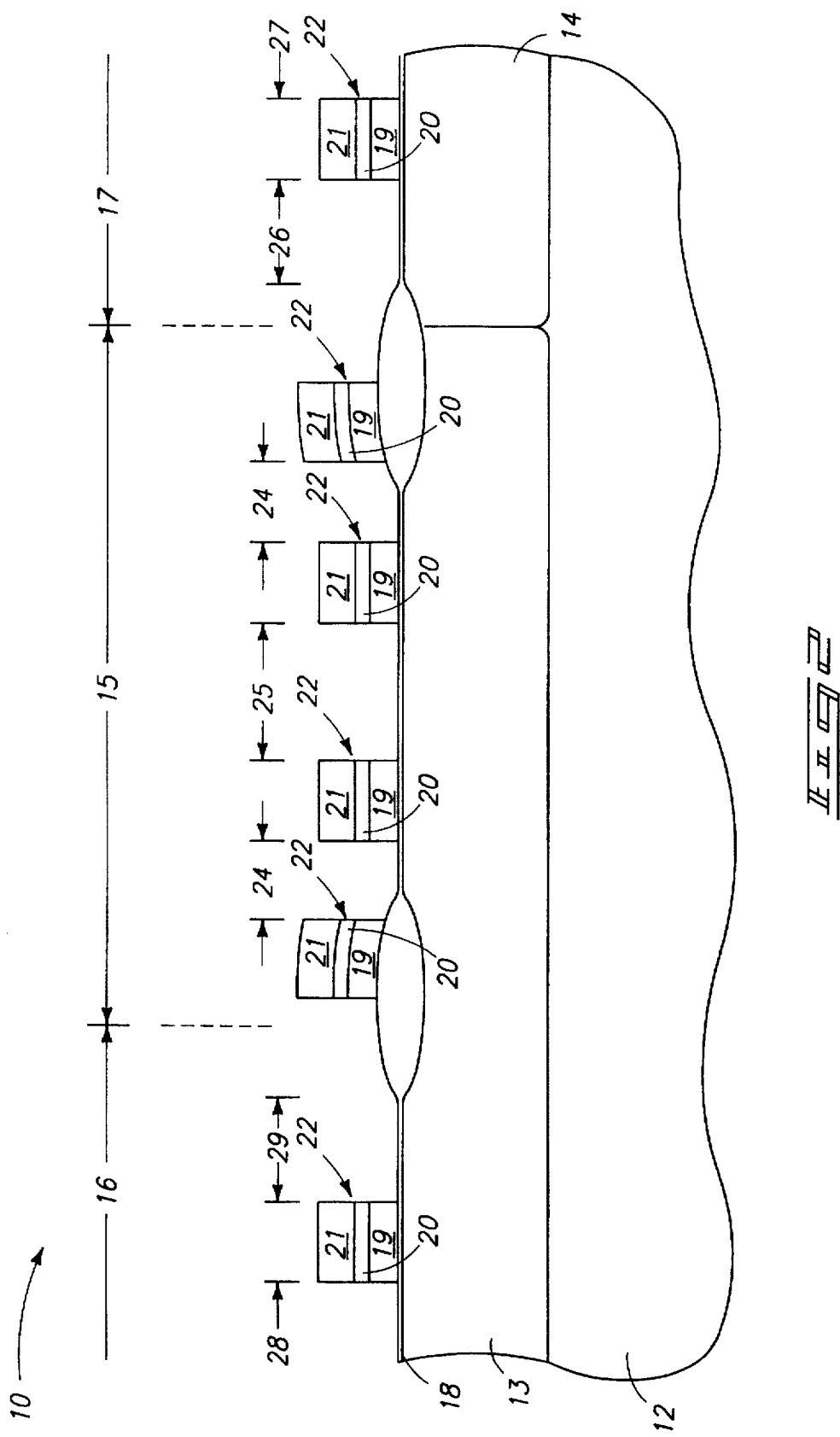
FIG. 2 is a view of the FIG. 1 wafer fragment at a processing step subsequent to that shown by FIG. 1.

Referring to FIG. 2, layers 19, 20 and 21 are patterned to provide a plurality of patterned gate lines 22 within memory array area 15, first peripheral area 16, and second peripheral area 17. Gate lines 22 define respective source areas and drain areas adjacent thereto which will be subsequently doped for providing desired transistor diffusion regions. For purposes of the continuing discussion, areas 24 within memory array area 15 comprise source areas which will ultimately be utilized for forming source regions which ohmically electrically connect with the storage node plates of respective DRAM capacitors. Area 25 within memory array area 15 comprises a drain area which will ultimately be utilized for forming a drain region within the substrate and ohmically electrically connect with a bit line. Likewise, areas 28 and 29 in first peripheral area 16 comprise respective source and drain regions therein, while areas 26 and 27 within second peripheral area 17 comprise respective source and drain areas therein. The positions of 26 and 27 could be swapped, as well as those of 28 and 29, depending upon selective operation of the circuitry as to whether one diffusion region functions as a source or as a drain. Nomenclature within array area 15 is used in its art accepted sense, wherein it is generally accepted that the source of a field effect transistor in a DRAM cell connects with the capacitor, whereas the drain within such a cell connects with the bit line.

Figure 3:
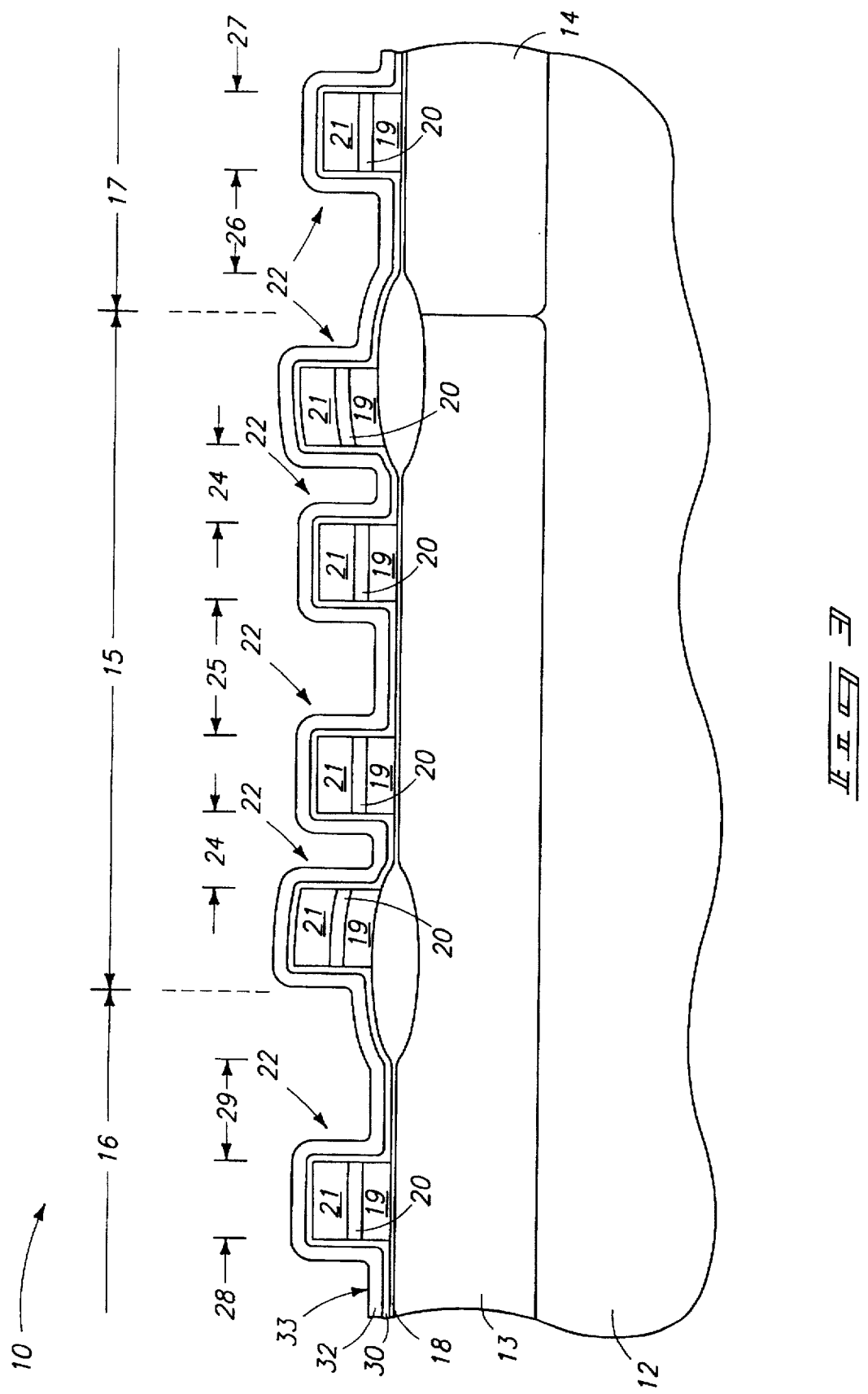
FIG. 3 is a view of the FIG. 1 wafer fragment at a processing step subsequent to that shown by FIG. 2.

Referring to FIG. 3, a first layer 30 of insulating (oxide) material, such as SiO$_2$, is deposited, followed by provision of a second oxide layer 32. Example thicknesses for each of layers 30 and 32 are 1500 Angstroms. Such layers might comprise the same or different materials such as one or a combination of doped or undoped oxides. Accordingly, even if layers 30 and 32 comprise doped or undoped oxide, each would comprise the same predominant oxide material. Layers 32 and 30 in the preferred embodiment comprise or define a composite insulating dielectric layer 33 within array area 15, first peripheral area 16 and second peripheral area 17 over gate lines 22, source areas 24, 28, 26, and drain areas 25, 27. Layers 30 and 32 are typically provided in conjunction with other wafer processing not particularly pertinent to this invention. For example, such would typically be utilized for masked n-type LDD and/or NMOS halo implants or masked p-channel halo and/or p-channel LDD implants. Other processing could also occur, such as by way of example only, source/drain reoxidation. Such are common and typical in high performance CMOS transistor fabrication, but are not otherwise referred to herein as not being particularly material to that which is claimed as invention. Nevertheless, layers 30 and 32 (or collectively composite layer 33) do provide a partial etch stop or a buffering function in subsequent processing in accordance with certain aspects of the invention, which will be apparent from the continuing discussion.

Figure 4:
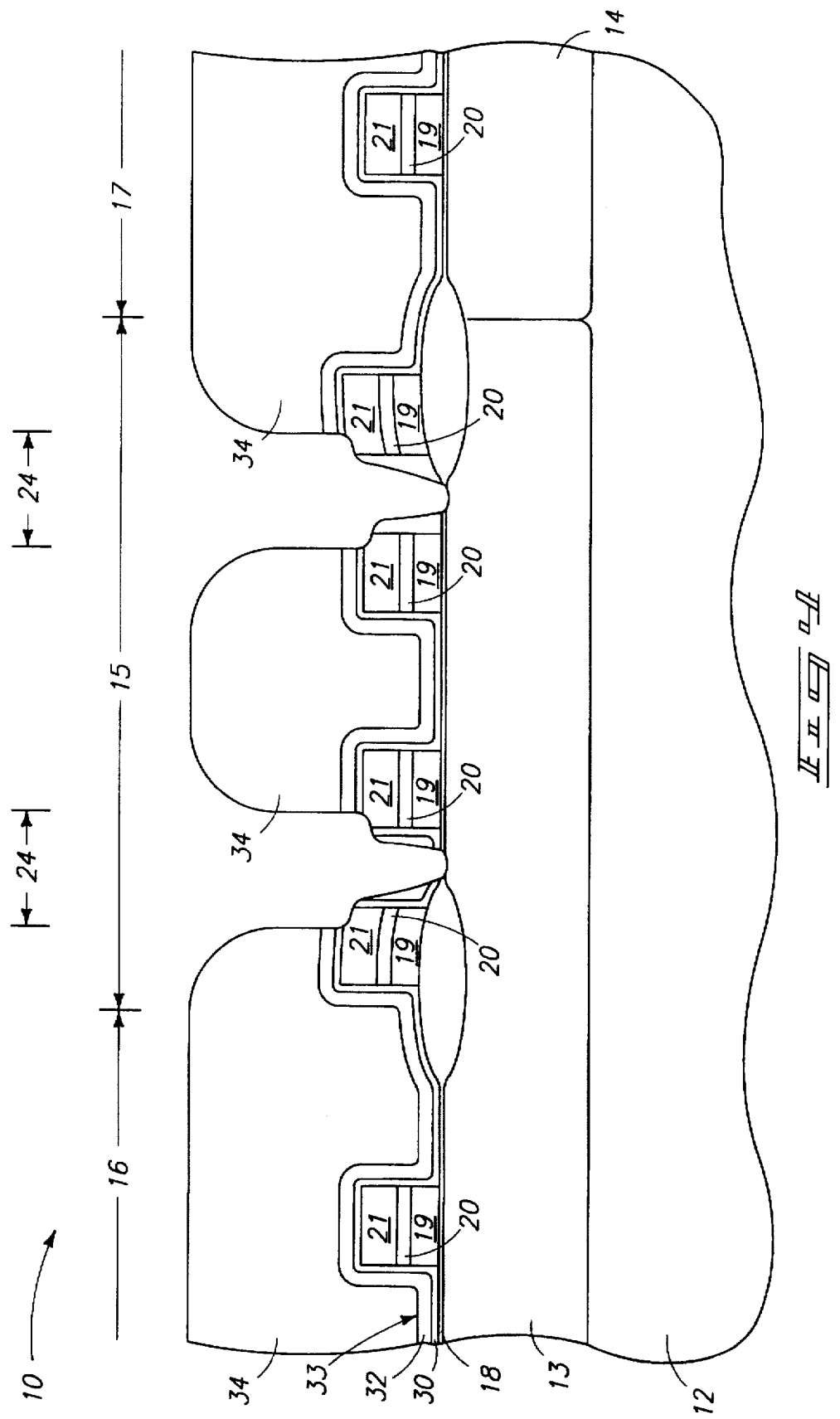
FIG. 4 is a view of the FIG. 1 wafer fragment at a processing step subsequent to that shown by FIG. 3.

Referring to FIG. 4, a layer 34 of photoresist is deposited and patterned as shown for outwardly exposing selected source areas 24 within array area 15. Insulating dielectric layer 33 is then etched as shown.

Figure 5:
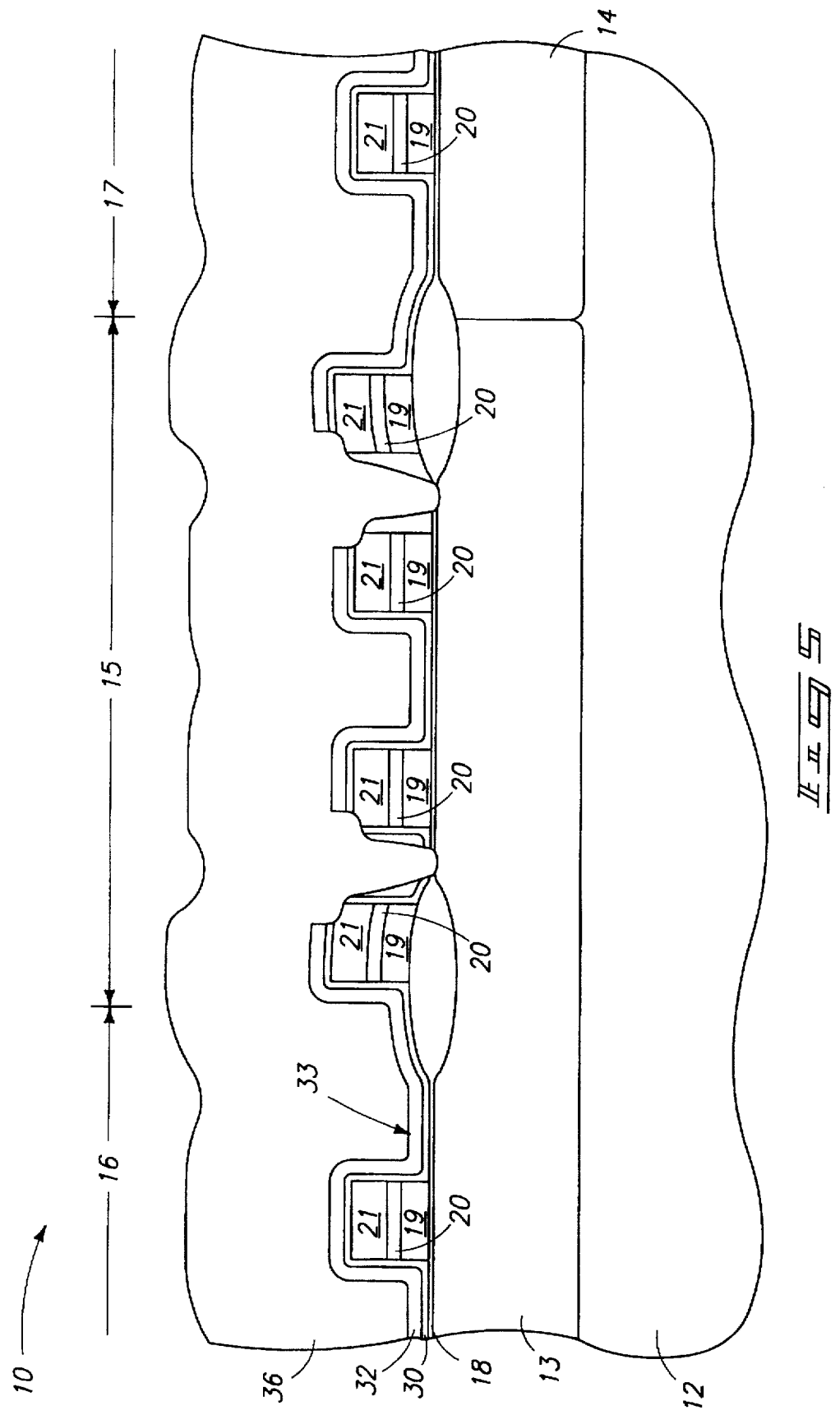
FIG. 5 is a view of the FIG. 1 wafer fragment at a processing step subsequent to that shown by FIG. 4.

Referring to FIG. 5, photoresist masking layer 34 is removed and an electrically conductive capacitor storage node layer 36 provided over patterned insulating dielectric layer 33. Such preferably comprises heavily conductively doped polysilicon having an example dopant concentration of at least $1 \times 10^{20}$ ions/cm$^3$.

Figure 6:
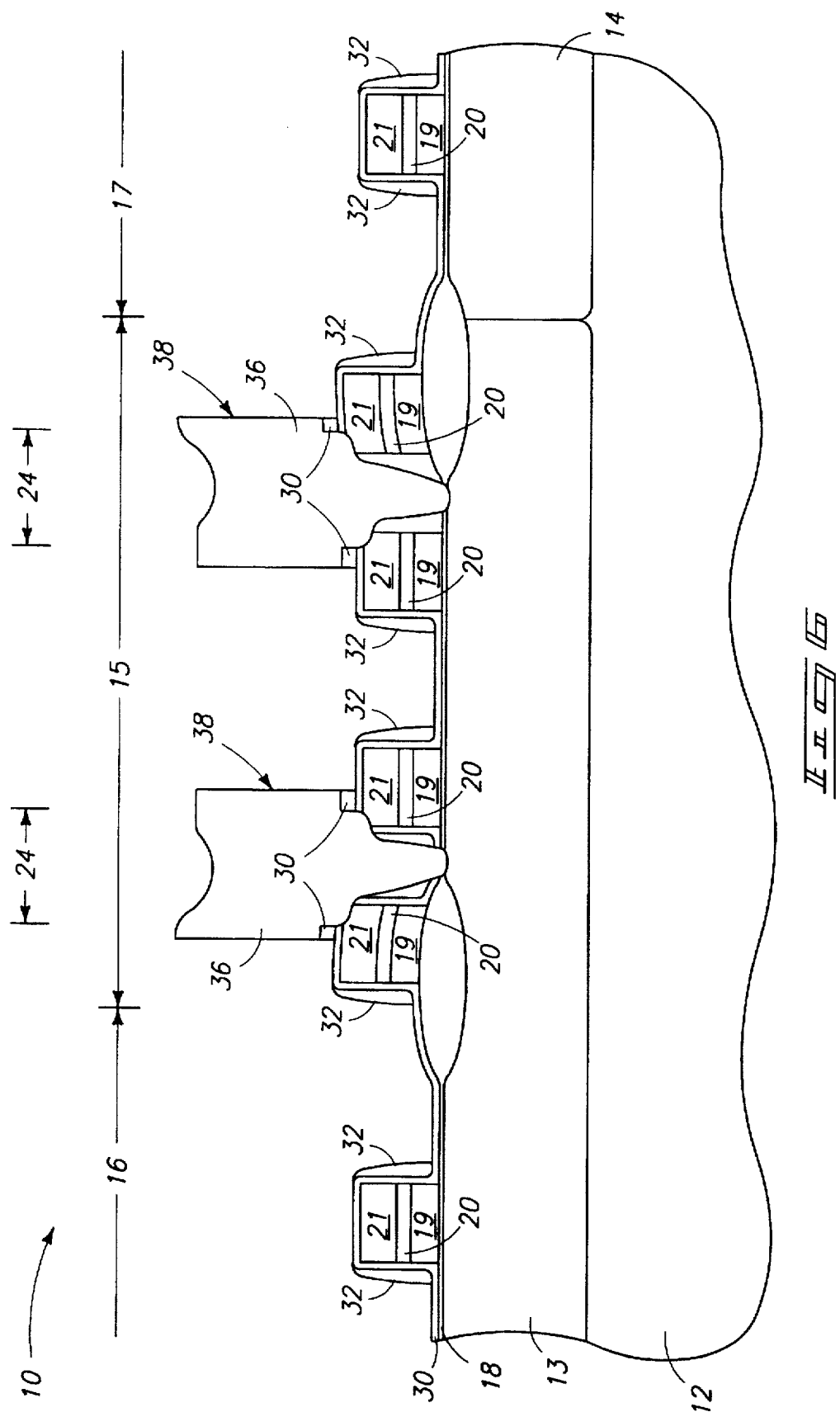
FIG. 6 is a view of the FIG. 1 wafer fragment at a processing step subsequent to that shown by FIG. 5.

Referring to FIG. 6, capacitor storage node layer 36 is patterned and etched to define respective capacitor storage nodes 38 over selected array source areas 24, with the storage node etching effectively stopping relative to insulating dielectric layer 33. For example, the etch utilized to define storage nodes 38 is typically highly selective at a 5:1 or higher ratio of removal rate of silicon relative to oxide. However, considerable over-etching is preferably conducted because of the wafer topography, and may result in substantially etching through outer insulating dielectric portion 32 but substantially not through insulating dielectric portion 30 in spite of the 5:1 selectivity. Regardless of whether stopping occurs relative to layer 30, some of composite layer 33 should remain after the FIG. 6 etch.

Figure 7:
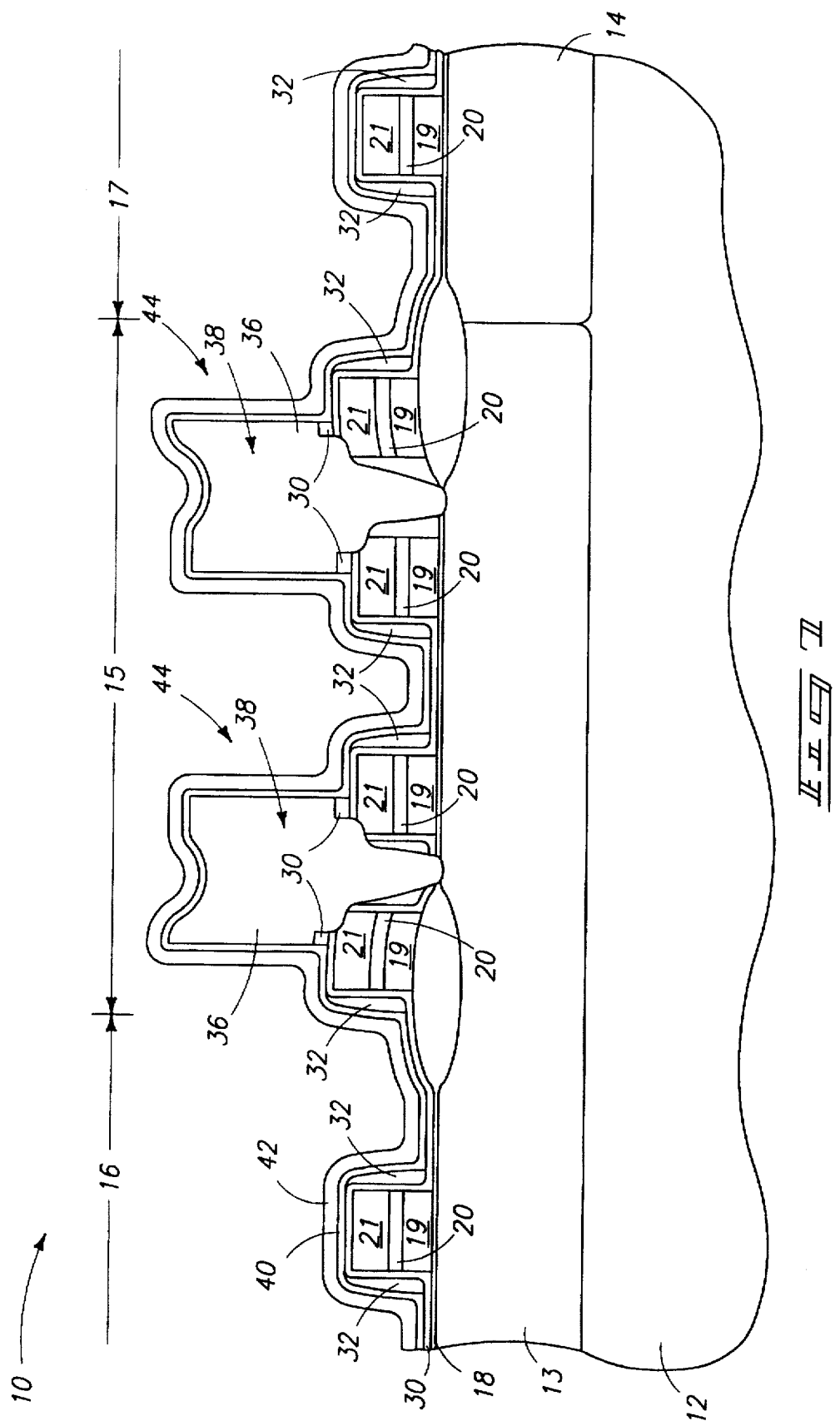
FIG. 7 is a view of the FIG. 1 wafer fragment at a processing step subsequent to that shown by FIG. 6.

Referring to FIG. 7, a capacitor dielectric layer 40 and an electrically conductive capacitor cell plate layer 42 are provided over capacitor storage nodes 38 and first peripheral area 16 and second peripheral area 17. An example and preferred material for layer 40 would be a nitride, or an O—N—O composite, having an overall thickness of 90 Angstroms. The preferred material for layer 42 is conductively doped polysilicon, with an example thickness being from about 500 Angstroms to about 1000 Angstroms. Thus, DRAM array capacitors 44 are substantially formed.

Figure 8B:
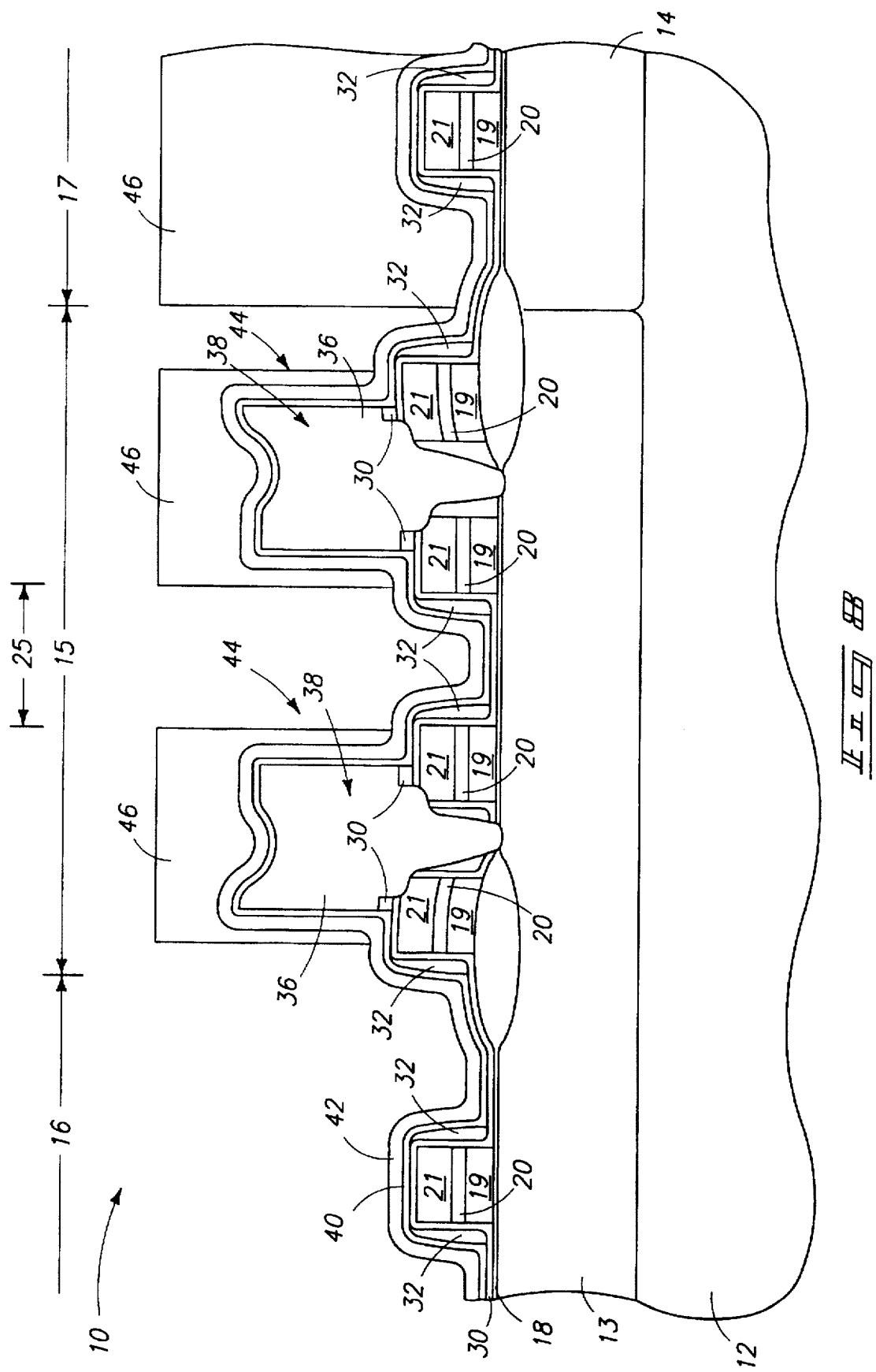
FIG. 8 is a view of the FIG. 1 wafer fragment at a processing step subsequent to that shown by FIG. 7.

Referring to FIG. 8, a layer of photoresist is deposited and patterned as shown to cover array storage nodes 38 and to cover second peripheral area 17, while leaving selected drain areas 25 within array area 15 and the first peripheral area 16 unmasked, with such processing hereinafter being referred to as a first photomasking. Alternately but less preferred (not shown), layer 46 can be patterned such that at this point in the process drain areas are not exposed and remain masked.

Figure 9:
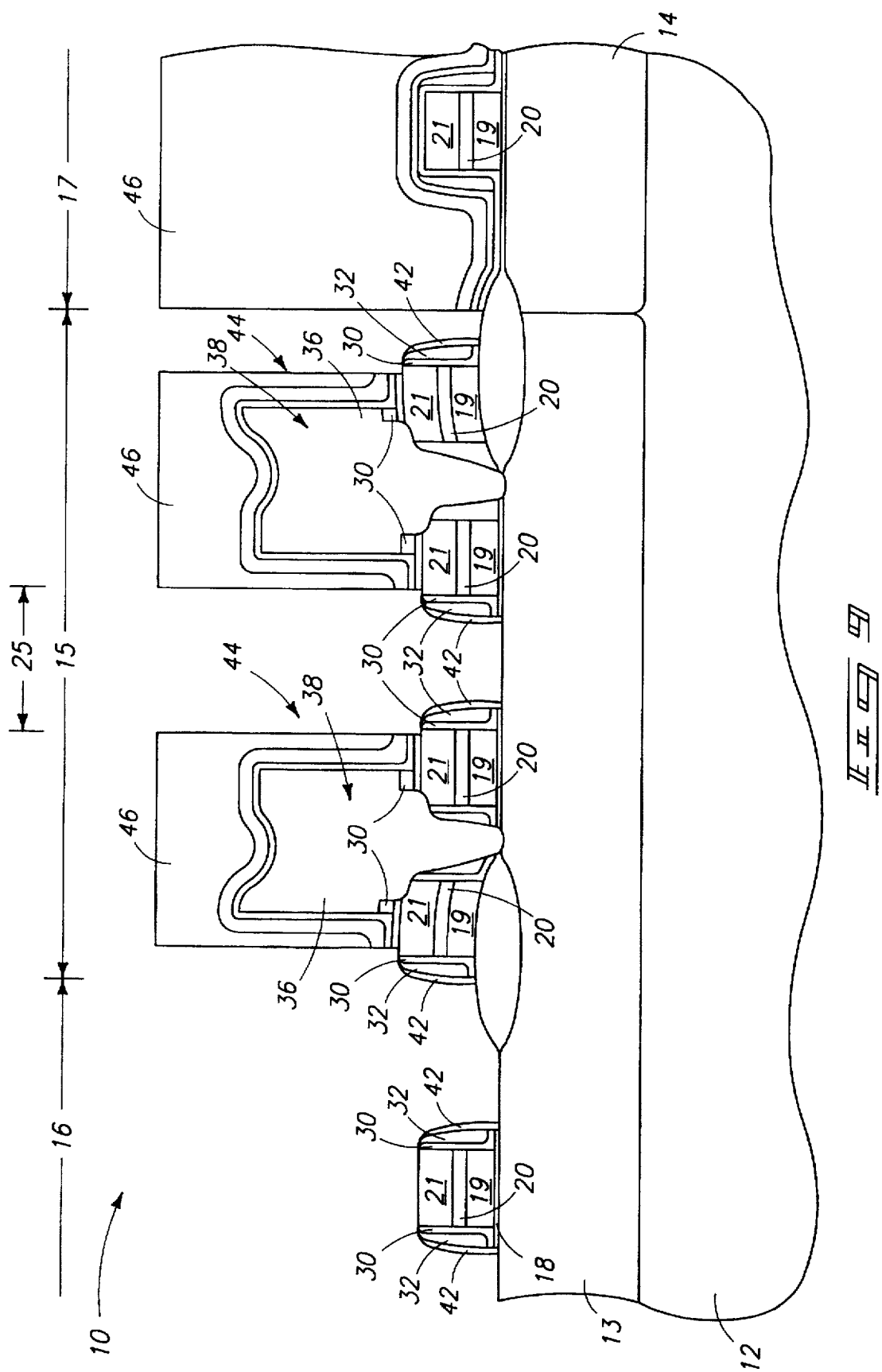
FIG. 9 is a view of the FIG. 1 wafer fragment at a processing step subsequent to that shown by FIG. 8.

Referring to FIG. 9 and with first photomasking 46 in place, capacitor cell plate layer 40 and underlying layers are first etched to effectively expose selected array drain areas 25 as well as first peripheral area 16.

Figure 10:
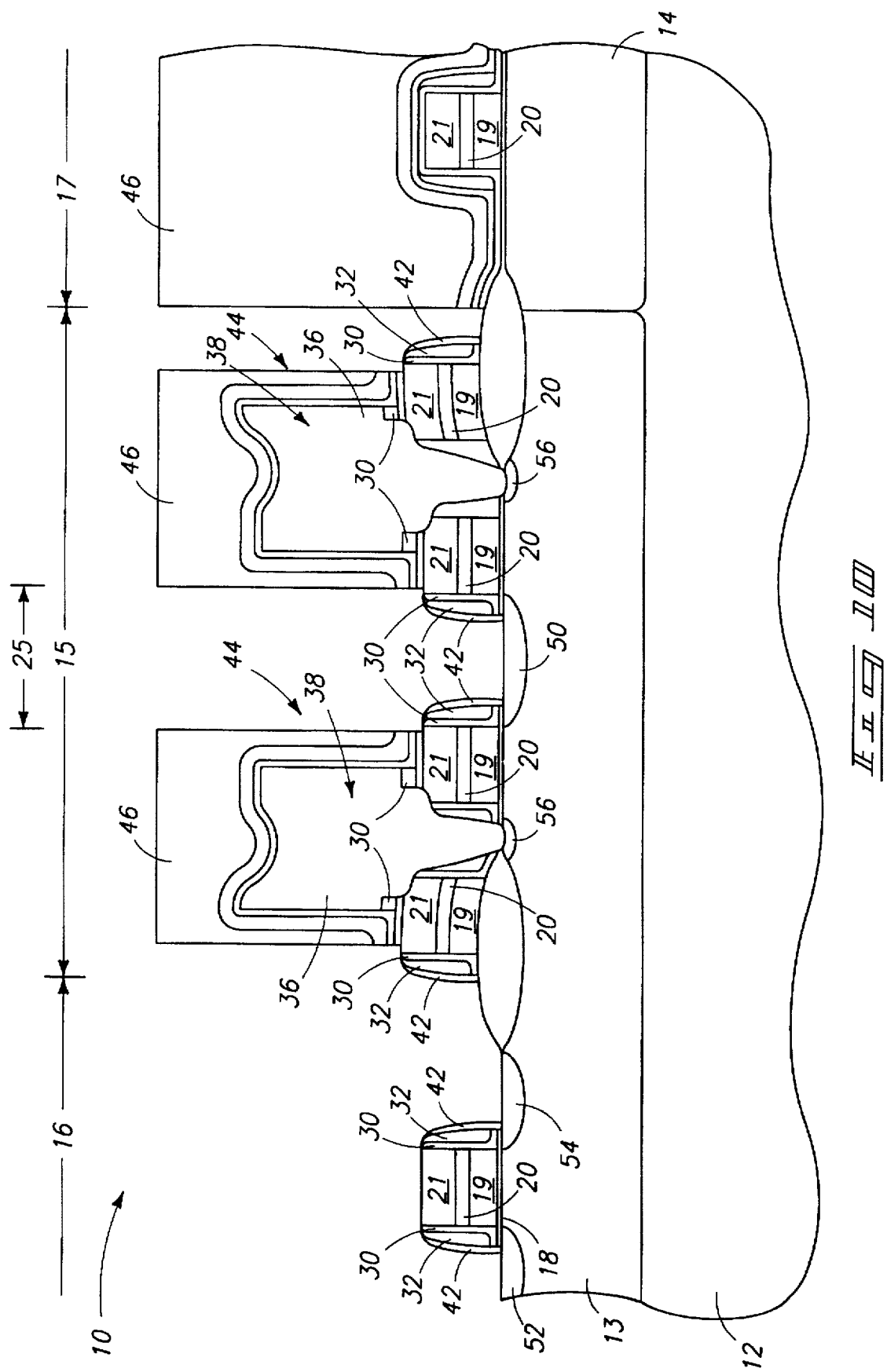
FIG. 10 is a view of the FIG. 1 wafer fragment at a processing step subsequent to that shown by FIG. 9.

Referring to FIG. 10 and with first photomasking 46 still in place, first conductivity type dopant impurity (in the described example, "n") is implanted into selected array drain areas 25 and first peripheral area 16 to form conductively doped array drain regions 50 and conductively doped first peripheral area source and drain regions 52 and 54, respectively. Alternately, layer 46 could be stripped for an n-type implant since in such instances layer 40 typically comprises n-type doped polysilicon and masking thereof is not necessary. Regardless, in a single and common masking step, cell plate layer 42 is patterned and etched to effectively outwardly expose drain areas within a DRAM array, and ion implanting is then conducted into the DRAM array drain areas to form electrically conductive drain regions within the substrate in the array area.

Selected array source areas 24 are also conductively doped at some point in the process with first conductivity type material to define electrically conductive first type source regions 56 within substrate 12 in array area 15. Preferably, such conductively doping to provide conductively doped source regions 56 consists essentially of outdiffusion of first conductivity type dopant impurity from capacitor storage node layer 36. Therefore in accordance with the preferred embodiment, the memory array drain areas and the peripheral circuitry area source and drain areas are conductively doped to provide the desired high concentration diffusion regions after formation of the DRAM array capacitors 44.

Figure 11:
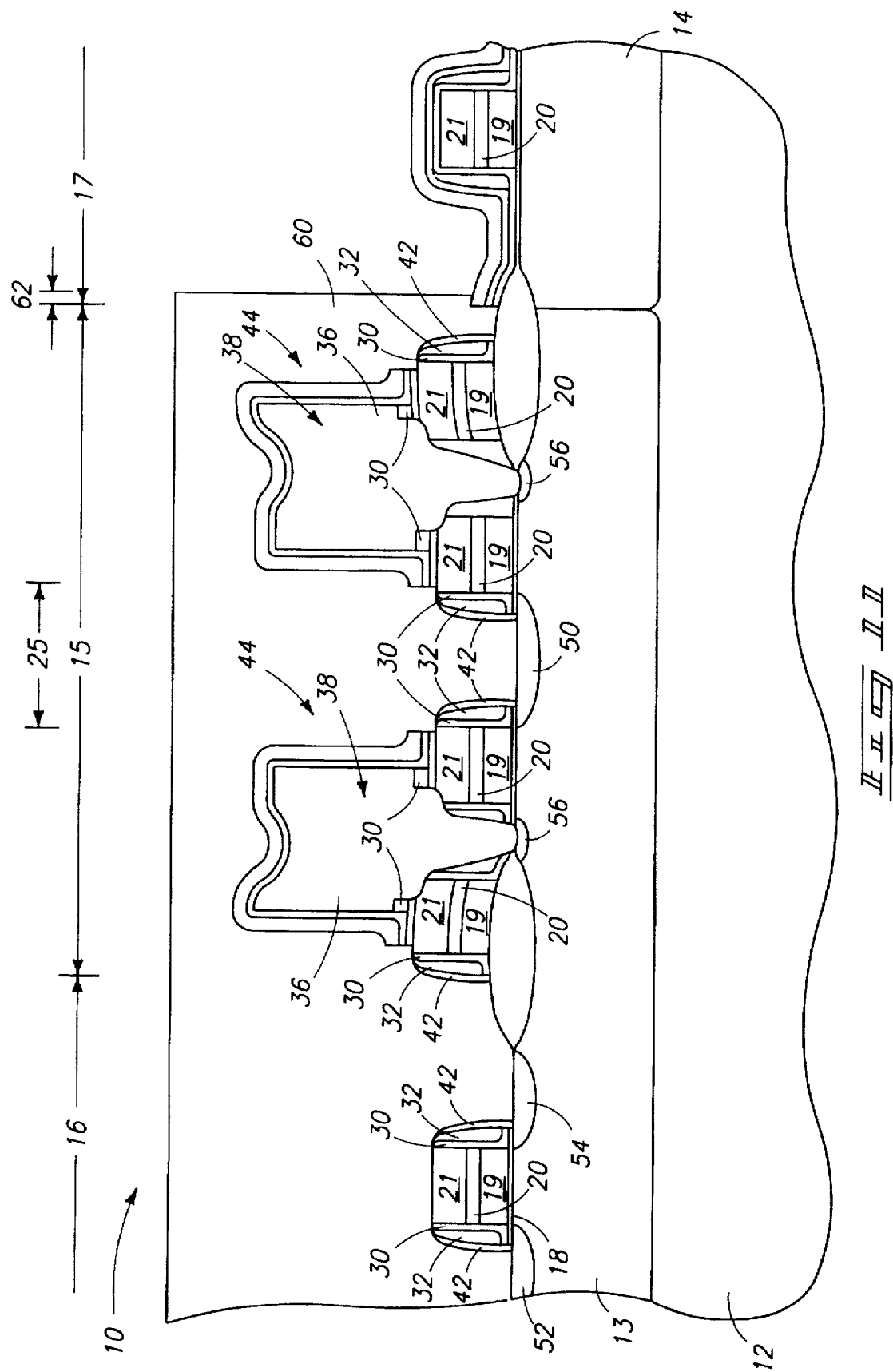
FIG. 11 is a view of the FIG. 1 wafer fragment at a processing step subsequent to that shown by FIG. 10.

Referring to FIG. 11, first photomasking 46 (not shown) is removed and a second photomasking layer 60 is provided to cover array area 15 and first peripheral area 16 while leaving second peripheral area 17 exposed. Second masking layer 60 preferably overlaps with a portion 62 of second peripheral area 17, and thereby a portion of capacitor cell plate layer 42 and capacitor dielectric layer 40 in second peripheral area 17.

Figure 12:
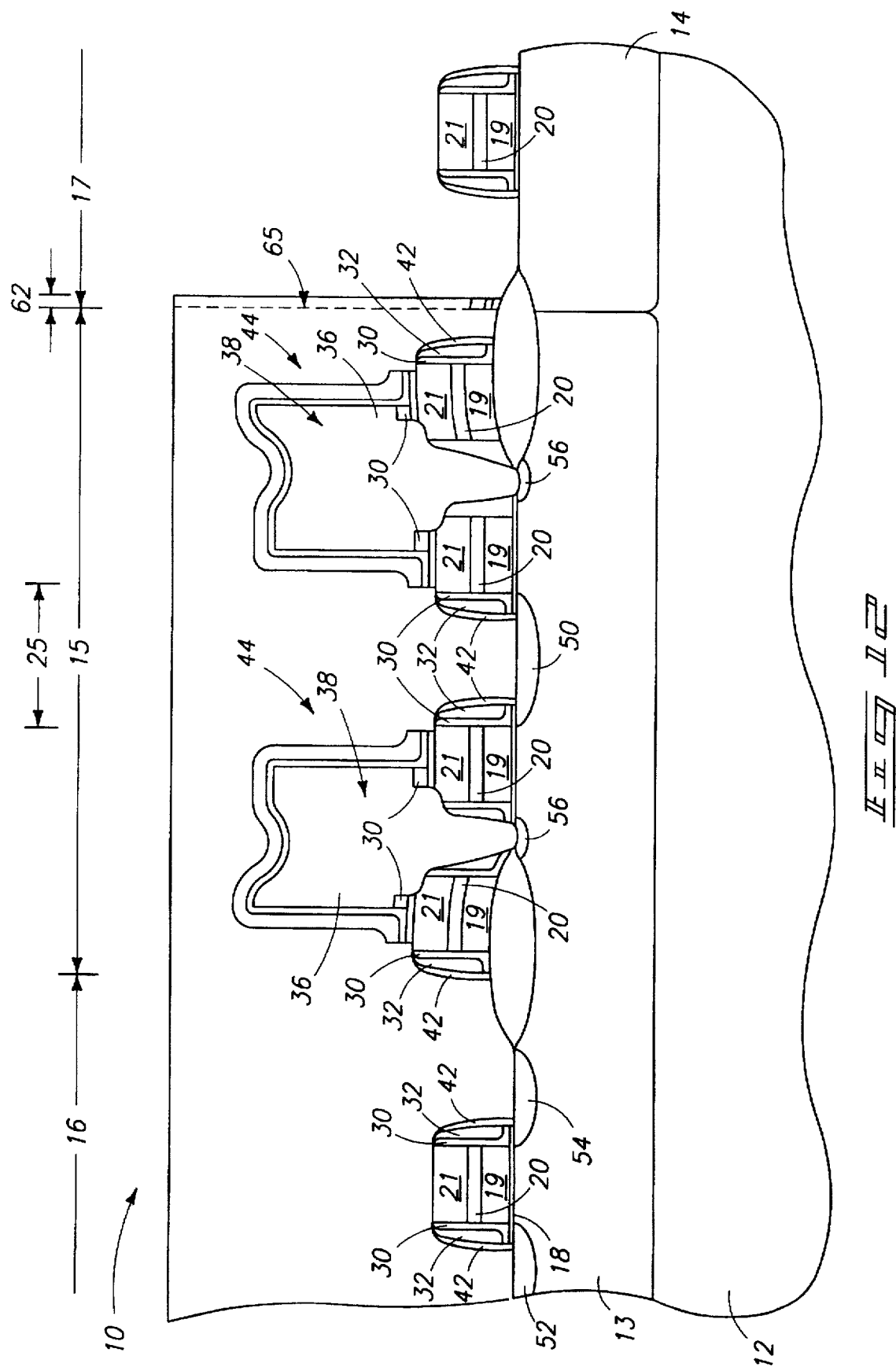
FIG. 12 is a view of the FIG. 1 wafer fragment at a processing step subsequent to that shown by FIG. 11.

Referring to FIG. 12 and with second photomasking 60 in place, capacitor cell plate layer 42 and underlying layers are second etched from second peripheral area 17. This second etching step leaves a composite hedge or block 64 of capacitor cell plate layer 42 and capacitor dielectric layer 40 relative to an interface 65 of array area 15 and second peripheral area 17

Referring to FIG. 13 and with second photomasking 60 still in place, second conductivity type dopant impurity (in this example p-type) is implanted into source areas 26 and drain areas 27 in second peripheral area 17 to form conductively doped second peripheral area drain and source regions 68 and 70, respectively. Accordingly in the preferred embodiment, the collective steps of, a) first and second etching capacitor cell plate layer 42, b) first conductivity type implanting into peripheral area 16, and c) second conductivity type implanting into peripheral area 17 are conducted with no more photomasking steps than said first and second photomaskings. The prior art utilizes three separate photomasking steps for such collective steps when all NMOS and PMOS gates are defined in a single photomasking step. Most preferably in accordance with the invention, the above item "b" also includes first conductivity type implanting into array area 15 in the same step where selected array drain areas have been exposed in conjunction with exposure of peripheral n-type areas.

Referring to FIG. 14, photomasking 60 is removed and an insulating dielectric layer 72 deposited and patterned to provide a bit contact opening 74 to memory array drain region 50. Subsequently, a conductive material layer 76 is deposited and patterned to effectively form a bit line which ohmically electrically connects with drain region 50.

Further in accordance with an aspect of the invention, the capacitor cell plate layer is removed from the peripheral area and bit line contacts openings provided through the capacitor cell plate layer to selected drains in the array area in two separate photomasking and two separate etching steps. The prior art heretofore conducts patterning and removal of the cell plate layer in a single masking and etching step.

The above described embodiment with reference to the figures was with respect to a preferred embodiment bit line over capacitor array construction. However, the invention in its broadest aspects also contemplates fabrication of capacitor over bit line constructions.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents

I claim:

1. A method of forming DRAM circuitry on a semiconductor substrate having complementary metal oxide semiconductor field effect transistors and associated capacitors comprising the following steps:

defining a memory array area on a substrate for formation of first conductivity type DRAM field effect transistors and defining an area peripheral to the array on the substrate for formation of first and second conductivity type CMOS field effect transistors, the peripheral area comprising first and second peripheral areas, the first and second conductivity type transistors to be formed in the first and second peripheral areas, respectively;

providing a plurality of patterned gate lines within the memory array area, the first peripheral area and the second peripheral area; the gate lines defining respective source areas and drain areas adjacent thereto;

providing an insulating dielectric layer within the array area and the first and second peripheral areas over the gate lines, the source areas and the drain areas;

patterning and etching the insulating dielectric layer to outwardly expose selected source areas within the array area;

providing an electrically conductive capacitor storage node layer over the patterned insulating dielectric layer;

patterning and etching the capacitor storage node layer to define respective capacitor storage nodes over the selected array source areas, the storage node etching not going completely through the insulating dielectric layer;

providing a capacitor dielectric layer and an electrically conductive capacitor cell plate layer over the capacitor storage nodes and the first and second peripheral areas;

first photomasking the cell plate layer to cover the array storage nodes and to cover the second peripheral area, while leaving selected source or areas within the array and the first peripheral area unmasked;

with the first photomasking in place, first etching the capacitor cell plate layer and insulating dielectric layer to effectively expose the selected array drain areas and the first peripheral area;

after effectively exposing the selected array drain areas and the first peripheral area source and drain areas and with the first photomasking still in place, implanting first conductivity type dopant impurity into the selected array drain areas and the first peripheral area to form conductively doped array drain regions and conductively doped first peripheral area source and drain regions;

second photomasking the array area and the first peripheral area while leaving the second peripheral area exposed;

with the second photomasking in place, second etching the capacitor cell plate layer and the capacitor dielectric layer from the second peripheral area; and with the second photomasking in place and after the second etching of the capacitor cell layer, implanting second conductivity type dopant impurity into the source areas and the drain areas in the second peripheral area to form conductively doped second peripheral area drain and source regions.

2. The method of forming DRAM circuitry of claim 1 wherein the insulating dielectric layer comprises oxide.

3. The method of forming DRAM circuitry of claim 1 wherein the insulating dielectric layer comprises a composite of at least two separately deposited layers.

4. The method of forming DRAM circuitry of claim 1 wherein the insulating dielectric layer comprises a composite of at least two separately deposited layers, the separately deposited layers comprising the same predominate material.

5. The method of forming DRAM circuitry of claim 1 wherein, the insulating dielectric layer comprises a composite of at least two separately deposited layers; and the step of etching the capacitor storage node layer comprising substantially etching through one of the two layers but substantially not through the other of the two layers.

6. The method of forming DRAM circuitry of claim 1 wherein the collective steps of, a) first and second etching the capacitor cell plate, b) first conductivity type implanting, and c) second conductivity type implanting are conducted with no more photomasking steps than said first and second photomaskings.

7. The method of forming DRAM circuitry of claim 1 wherein the first conductivity type is n and the second conductivity type is p.

8. The method of forming DRAM circuitry of claim 1 wherein the first conductivity type is p and the second conductivity type is n.

9. The method of forming DRAM circuitry of claim 1 wherein the second masking occurs after the first masking.

10. The method of forming DRAM circuitry of claim 1 wherein the second masking overlaps with a portion of the second peripheral area and thereby a portion of the capacitor cell plate layer and capacitor dielectric layer in the second peripheral area, the second etching step leaving a composite hedge of the capacitor cell plate layer and capacitor dielectric layer relative to an interface of the array area and the second peripheral area.

11. The method of forming DRAM circuitry of claim 1 wherein, the insulating dielectric layer comprises a composite of at least two separately deposited layers; and the collective steps of, a) first and second etching the capacitor cell plate, b) first conductivity type implanting, and c) second conductivity type implanting are conducted with no more photomasking steps than said first and second photomaskings.

12. The method of forming DRAM circuitry of claim 1 wherein, the insulating dielectric layer comprises a composite of at least two separately deposited layers; and the capacitor storage node layer comprises first conductivity type dopant material, the conductively doping step consisting essentially of out-diffusion of first conductivity type dopant impurity from the capacitor storage node layer.

13. The method of forming DRAM circuitry of claim 1 wherein, the insulating dielectric layer comprises a composite of at least two separately deposited layers; and the second masking overlaps with a portion of the second peripheral area and thereby a portion of the capacitor cell plate layer and capacitor dielectric layer in the second peripheral area, the second etching step leaving a composite hedge of the capacitor cell plate layer and capacitor dielectric layer relative to an interface of the array area and the second peripheral area.

14. The method of forming DRAM circuitry of claim 1 wherein, the collective steps of, a) first and second etching the capacitor cell plate, b) first conductivity type implanting, and c) second conductivity type implanting are conducted with no more photomasking steps than said first and second photomaskings; and the capacitor storage node layer comprises first conductivity type dopant material, the conductively doping step consisting essentially of out-diffusion of first conductivity type dopant impurity from the capacitor storage node layer.

15. The method of forming DRAM circuitry of claim 1 wherein, the collective steps of a) first and second etching the capacitor cell plate, b) first conductivity type implanting, and c) second conductivity type implanting are conducted with no more photomasking steps than said first and second photomaskings; and the second masking overlaps with a portion of the second peripheral area and thereby a portion of the capacitor cell plate layer and capacitor dielectric layer in the second peripheral area, the second etching step leaving a composite hedge of the capacitor cell plate layer and capacitor dielectric layer relative to an interface of the array area and the second peripheral area.

16. The method of forming DRAM circuitry of claim 1 wherein, the capacitor storage node layer comprises first conductivity type dopant material, the conductively doping step consisting essentially of out-diffusion of first conductivity type dopant impurity from the capacitor storage node layer; and the second masking overlaps with a portion of the second peripheral area and thereby a portion of the capacitor cell plate layer and capacitor dielectric layer in the second peripheral area, the second etching step leaving a composite hedge of the capacitor cell plate layer and capacitor dielectric layer relative to an interface of the array area and the second peripheral area.

17. The method of forming DRAM circuitry of claim 1 wherein, the insulating dielectric layer comprises a composite of at least two separately deposited layers;

the collective steps of, a) first and second etching the capacitor cell plate, b) first conductivity type implanting, and c) second conductivity type implanting are conducted with no more photomasking steps than said first and second photomaskings; and the second masking overlaps with a portion of the second peripheral area and thereby a portion of the capacitor cell plate layer and capacitor dielectric layer in the second peripheral area, the second etching step leaving a composite hedge of the capacitor cell plate layer and capacitor dielectric layer relative to an interface of the array area and the second peripheral area.

18. The method of forming DRAM circuitry of claim 1 wherein, the collective steps of, a) first and second etching the capacitor cell plate, b) first conductivity type implanting, and c) second conductivity type implanting are conducted with no more photomasking steps than said first and second photomaskings;

the capacitor storage node layer comprises first conductivity type dopant material, the conductively doping step consisting essentially of out-diffusion of first conductivity type dopant impurity from the capacitor storage node layer; and the second masking overlaps with a portion of the second peripheral area and thereby a portion of the capacitor cell plate layer and capacitor dielectric layer in the second peripheral area, the second etching step leaving a composite hedge of the capacitor cell plate layer and capacitor dielectric layer relative to an interface of the array area and the second peripheral area.

19. A method of forming DRAM circuitry on a semiconductor substrate having complementary metal oxide semiconductor field effect transistors and associated capacitors comprising the following steps:

defining a memory array area on a substrate for formation of first conductivity type DRAM field effect transistors and defining an area peripheral to the array on the substrate for formation of first and second conductivity type CMOS field effect transistors, the peripheral area comprising first and second peripheral areas, the first and second conductivity type transistors to be formed in the first and second peripheral areas, respectively;

providing a plurality of patterned gate lines within the memory array area, the first peripheral area and the second peripheral area; the gate lines defining respective source areas and drain areas adjacent thereto;

providing an insulating dielectric layer within the array area and the first and second peripheral areas over the gate lines, the source areas and the drain areas;

patterning and etching the insulating dielectric layer to outwardly expose selected source areas within the array area;

providing an electrically conductive capacitor storage node layer over the patterned insulating dielectric layer;

patterning and etching the capacitor storage node layer to define respective capacitor storage nodes over the selected array source areas, the storage node etching stopping relative to the insulating dielectric layer;

providing a capacitor dielectric layer and an electrically conductive capacitor cell plate layer over the capacitor storage nodes and the first and second peripheral areas;

first photomasking the cell plate layer to cover the array storage nodes and to cover the second peripheral area, while leaving the first peripheral area unmasked;

with the first photomasking in place, first etching the capacitor cell plate layer and insulating dielectric layer to effectively expose first peripheral area source and drain areas;

after effectively exposing the first peripheral area source and drain areas and with the first photomasking still in place, implanting first conductivity type dopant impurity into the first peripheral area to form conductively doped first peripheral area source and drain regions;

second photomasking the array area and the first peripheral area while leaving the second peripheral area exposed;

with the second photomasking in place, second etching the capacitor cell plate layer and the capacitor dielectric layer from the second peripheral area; and with the second photomasking in place and after the second etching of the capacitor cell layer, implanting second conductivity type dopant impurity into the source areas and the drain areas in the second peripheral area to form conductively doped second peripheral area drain and source regions.

20. The method of forming DRAM circuitry of claim 19 wherein the insulating dielectric layer comprises a composite of at least two separately deposited layers.

21. The method of forming DRAM circuitry of claim 19 wherein the insulating dielectric layer comprises a composite of at least two separately deposited layers, the separately deposited layers comprising the same predominate material.

22. The method of forming DRAM circuitry of claim 19 wherein, the insulating dielectric layer comprises a composite of at least two separately deposited layers; and the step of etching the capacitor storage node layer comprising substantially etching through one of the two layers but substantially not through the other of the two layers.

23. The method of forming DRAM circuitry of claim 19 wherein the collective steps of, a) first and second etching the capacitor cell plate, b) first conductivity type implanting, and c) second conductivity type implanting are conducted with no more photomasking steps than said first and second photomaskings.

24. The method of forming DRAM circuitry of claim 19 wherein the second masking occurs after the first masking.

25. The method of forming DRAM circuitry of claim 19 wherein the second masking overlaps with a portion of the second peripheral area and thereby a portion of the capacitor cell plate layer and capacitor dielectric layer in the second peripheral area, the second etching step leaving a composite hedge of the capacitor cell plate layer and capacitor dielectric layer relative to an interface of the array area and the second peripheral area.

26. A method of forming DRAM circuitry on a semiconductor substrate having complementary metal oxide semiconductor field effect transistors and associated capacitors comprising the following steps:

defining a memory array area on a substrate for formation of first conductivity type DRAM field effect transistors and defining an area peripheral to the array on the substrate for formation of second conductivity type field effect transistors;

providing a plurality of patterned gate lines within the memory array area and the peripheral area the gate lines defining respective source areas and drain areas adjacent thereto;

providing capacitor storage nodes over selected array source areas;

providing a capacitor dielectric layer and an electrically conductive capacitor cell plate layer over the capacitor storage nodes and the peripheral area; and in two separate photomasking and two separate etching steps, collectively etching the capacitor cell plate layer to substantially remove cell plate material from the peripheral area and provide bit line contact openings through the capacitor cell plate layer to selected drains in the array area.

27. The method of forming DRAM circuitry of claim 26 wherein one of the photomasking and etching steps comprises a single and common masking step utilized in patterning and etching the cell plate layer to effectively outwardly expose selected drain areas within the array and then implanting a conductivity dopant impurity into the selected array drain areas to form electrically conductive drain regions within the substrate in the array area.

28. The method of forming DRAM circuitry of claim 26 further comprising conductively doping array drain areas and peripheral area source and drain areas to form electrically conductive drain regions within the substrate in the array area and electrically conductive source and drain regions in the peripheral area, the conductively doping to form such regions being conducted after provision of the capacitor cell plate layer; and wherein one of the photomasking and etching steps comprises a single and common masking step utilized in patterning and etching the cell plate layer to effectively outwardly expose selected drain areas within the array and then implanting a conductivity dopant impurity into the selected array drain areas to form electrically conductive drain regions within the substrate in the array area.

29. A method of forming DRAM circuitry on a semiconductor substrate having complementary metal oxide semiconductor field effect transistors and associated capacitors comprising the following steps:

defining a memory array area on a substrate for formation of first conductivity type DRAM field effect transistors and defining an NMOS peripheral area and a PMOS peripheral area;

providing a plurality of patterned gate lines within the memory array area and the peripheral areas, the gate lines defining respective source areas and drain areas adjacent thereto;

providing capacitor storage nodes over selected array source areas;

providing a capacitor dielectric layer and an electrically conductive capacitor cell plate layer over the capacitor storage nodes and the peripheral areas; and in two separate photomasking and two separate etching steps, collectively, a) etching the capacitor cell plate layer to substantially remove cell plate material from the NMOS peripheral area and thereafter doping the NMOS peripheral area with n-type material, and b) etching the capacitor cell plate layer to substantially remove cell plate material from the PMOS peripheral area and thereafter doping the PMOS peripheral area with p-type material.

30. The method of forming DRAM circuitry of claim 29 wherein the first conductivity type is n.

31. A method of forming a memory device on a semiconductor substrate, comprising the steps of:

providing a structure on a semiconductor substrate, said structure comprising a memory array region having a plurality of memory array gate areas and a plurality of memory array storage nodes, and a periphery region comprising a plurality of periphery gate areas, said structure having a layer of a dielectric material and a layer of conductive material thereon;

forming a first mask over a first portion of said memory array region and over a first portion of said periphery region;

performing a first etch to remove unmasked portions of said conductive material layer and said dielectric layer;

first doping said substrate after said first etch with a dopant;

removing said first mask from said substrate structure;

forming a second mask over at least a second portion of said memory array region;

performing a second etch to remove unmasked portions of said dielectric material layer and said conductive material; and second doping said substrate with a second dopant.

32. The method of claim 31 wherein said step of performing said second etch further comprises etching an oxide layer beneath said dielectric material layer.

33. The method of claim 31 wherein said step of performing said first etch further comprises etching an oxide layer beneath said dielectric material layer.

34. The method of claim 31 wherein said first and second mask portions have areas in common with one another.

35. The method of claim 31 wherein the second mask is formed over all of the array region.

36. The method of claim 31 wherein the second mask is formed over some of the periphery region.

37. The method of claim 31 wherein said first doping is conducted with the first mask in place.

38. The method of claim 31 wherein said second doping is conducted with the second mask in place.

39. The method of claim 31 wherein said first doping is conducted with the first mask in place, and said second doping is conducted with the second mask in place.

40. The method of claim 31 wherein the second mask is formed over at least a portion of the periphery region, and the second etch leaves a composite hedge of the dielectric material and the conductive material relative to an interface of the array region and the periphery region.

41. A method of forming a memory device on a semiconductor substrate, comprising the steps of:

providing a structure on a semiconductor substrate, said structure comprising a memory array region having a plurality of memory array gate areas and a plurality of memory array storage nodes, and a periphery region comprising a plurality of periphery gate areas, said structure having a layer of a dielectric material and a layer of conductive material thereon;

forming a first mask over a first portion of said memory array region and over a first portion of said periphery region;

performing a first etch to remove unmasked portions of said conductive material layer and said dielectric layer;

with the first mask in place, first doping said substrate after said first etch with a dopant;

removing said first mask from said substrate structure;

forming a second mask over substantially all of said memory array region and some of said periphery region, said first and second mask portions have areas in common with one another in both the array region and the periphery region;

performing a second etch to remove unmasked portions of said dielectric material layer and said conductive material; and with the second mask in place, second doping said substrate with a second dopant.

42. The method of claim 41 wherein the second mask is formed over at least a portion of the periphery region, and the second etch leaves a composite hedge of the dielectric material and the conductive material relative to an interface of the array region and the periphery region.

43. A method of forming a memory device comprising the steps of:

providing a structure on a semiconductor substrate, said structure comprising a memory array region having a plurality of memory array gate areas and a plurality of memory storage nodes, and a periphery it region comprising a plurality of periphery gate areas, said structure having a layer of a dielectric material and a layer of conductive material thereon; and removing portions of said conductive layer and of said dielectric Is layer, and doping said substrate with a first dopant to form source areas and drain areas associated with each said gate area in said memory array region, and doping said substrate with a second dopant to form source and drain areas associated with said gate areas in said periphery region; said removing and said dopings being performed with no greater than two mask steps.

44. The method of claim 43 wherein said removing and said dopings are performed with two mask steps.

45. The method of claim 43 wherein at least one of said dopings comprises out diffusing a dopant from an adjacent doped layer.

46. The method of claim 43 wherein the removing step comprises at least two distinct removing steps using two distinct mask steps.

47. The method of claim 43 wherein the removing leaves a composite hedge of the dielectric material and the conductive material relative to an interface of the array region and the periphery region.

48. The method of claim 43 wherein the removing step comprises first and second distinct removing steps using respective first and second distinct mask steps, one of the mask and removing steps leaving a composite hedge of the dielectric material and the conductive material relative to an interface of the array region and the periphery region.

49. The method of claim 43 wherein the removing step comprises first and second distinct removing steps using respective first and second distinct mask steps, the second mask and the second removing step leaving a composite hedge of the dielectric material and the conductive material relative to an interface of the array region and the periphery region.

50. A method of forming a memory device comprising the steps of:

providing a structure on a semiconductor substrate, said structure comprising a memory array region having a plurality of memory array gate areas and a plurality of memory storage nodes, and a periphery region comprising a plurality of periphery gate areas, said structure having a layer of a dielectric material and a layer of conductive material thereon;

removing portions of said conductive layer and of said dielectric layer, and doping said substrate with a first dopant to form source areas and drain areas associated with each said gate area in said memory array region, and doping said substrate with a second dopant to form source and drain areas associated with said gate areas in said periphery region;

at least one of said dopings comprising out diffusing a dopant from an adjacent doped layer;

the removing comprising first and second distinct removing steps using respective first and second distinct mask steps, one of the mask and removing steps leaving a composite hedge of the dielectric material and the conductive material relative to an interface of the array region and the periphery region; and said removing and said dopings being performed with two mask steps.

51. A method of forming a memory device on a semiconductor substrate comprising the steps of:

providing a structure on said substrate, said structure comprising a memory array region having a first plurality of memory array gate areas and a plurality of memory array storage nodes, and an additional region comprising a plurality of additional gate areas, said structure having a layer of dielectric material and a layer of a conductive material formed thereon;

performing a first mask and patterning operation to remove first selected portions of said conductive layer and of said dielectric layer, and doping said substrate with said first mask in place;

removing said first mask from said structure; and performing a second mask and patterning operation to remove second selected portions of said conductive layer and of said dielectric layer, and doping said substrate with a second dopant with said second mask in place.

52. The method of claim 51 wherein said first and second mask overly portions of the substrate which are common with one another.

53. The method of claim 51 wherein the second mask is formed over at least some of the array region.

54. The method of claim 51 wherein the second mask is formed over all of the array region.

55. The method of claim 51 wherein the second mask is formed over some of the periphery region.

* * * * *

UNITED STATES PATENT AND TRADEMARK OFFICE
CERTIFICATE OF CORRECTION

PATENT NO. : 5,786,249
DATED : July 28, 1998
INVENTOR(S) : Charles H. Dennison

It is certified that error appears in the above-identified patent and that said Letters Patent is hereby corrected as shown below:

In column 1, line 17, after the word "layers", insert --.--

In column 1, line 62, after the word "invention", insert --.--

In column 2, line 23, after the number "13", insert --.--

In column 4, line 22, delete "49" and insert --4--

In column 13, line 11, delete the word "it"

In column 13, line 16, delete the word "Is"

Signed and Sealed this

Sixth Day of October, 1998

Attest:

BRUCE LEHMAN

Attesting Officer

Commissioner of Patents and Trademarks